United States Patent [19]

Okawa et al.

[11] Patent Number: 5,639,508
[45] Date of Patent: Jun. 17, 1997

[54] METHOD FOR PRODUCING A LAYERED PIEZOELECTRIC ELEMENT

[75] Inventors: Yasuo Okawa, Nagoya; Yasuji Chikaoka, Aichi-ken; Atsuo Sakaida, Gifu-ken; Yoshihumi Suzuki, Ena; Yoshiyuki Ikezaki, Nagoya, all of Japan

[73] Assignee: Brother Kogyo Kabushiki Kaisha, Nagoya, Japan

[21] Appl. No.: 613,662

[22] Filed: Mar. 11, 1996

[30] Foreign Application Priority Data

Mar. 16, 1995 [JP] Japan ................... 7-057019

[51] Int. Cl.⁶ .................... B05D 5/12; H04R 17/00
[52] U.S. Cl. .................... 427/100; 29/25.35; 310/328; 347/68; 347/70; 347/72
[58] Field of Search ............ 427/100; 29/25.35; 310/328; 347/68, 69, 70, 71, 72; 101/114, 129

[56] References Cited

U.S. PATENT DOCUMENTS 5,245,734  9/1993  Issartel ................... 29/25.35
5,266,964  11/1993  Takahashi et al. ............ 346/1.1
5,402,159  3/1995  Takahashi et al. ............ 347/9
5,512,793  4/1996  Takeuchi et al. ............. 310/328

FOREIGN PATENT DOCUMENTS 6-79871  3/1994  Japan .
7-3090   1/1995  Japan .

Primary Examiner—Benjamin Utech
Assistant Examiner—Brian K. Talbot
Attorney, Agent, or Firm—Oliff & Berridge

[57] ABSTRACT

A method of producing a layered piezoelectric element for producing a pressure fluctuation within a cavity of an ink jet print head to eject ink from within the cavity, the production method comprising the steps of screen printing a slurry of powdered piezoelectric material to form a piezoelectric ceramic layer; screen printing a conductive paste to form an internal electrode layer on the piezoelectric ceramic layer; and repeating in alternation the steps of screen printing the slurry of powdered piezoelectric material and screen printing the conductive paste to obtain a layered body with piezoelectric ceramic layers and internal electrode layers layered in alternation.

11 Claims, 7 Drawing Sheets

METHOD FOR PRODUCING A LAYERED PIEZOELECTRIC ELEMENT

BACKGROUND OF THE INVENTION

1. Field of the Invention

The present invention relates to a method for producing a layered piezoelectric element provided in an ink jet print head which ejects ink droplets to produce diagrams or characters by dots on a print medium.

2. Description of the Related Art

Piezoelectric elements for generating a displacement upon application of a voltage can obtain a large displacement amount when provided in a layered form with piezoelectric material and internal electrodes provided in alternation.

Japanese Patent Application (Kokai) No. HEI-6-79871 discloses a configuration typical for an ink jet print head. As shown in FIG. 1, vertically-displacing pillar-shaped piezoelectric ceramic elements 81 serving as layered actuators are formed from a block-shaped sintered body into which elongated grooves have been opened with a slicer or other instrument. The piezoelectric ceramic elements 81 are configured from stacks of thin piezoelectric element sheets alternating with thin internal electrodes. This configuration allows low voltage drive of the piezoelectric ceramic elements 81. The internal electrodes are exposed in alternation at opposing side surfaces of the piezoelectric ceramic elements 81. The internal electrodes are connected, by wire bonding or by other means, to a drive power source for supplying a voltage for driving the piezoelectric ceramic elements 81.

An elastic thin plate 82 is adhered to the tip ends of the pillar-shaped piezoelectric ceramic elements 81. Further, a nozzle plate 84 made from resin and formed with ink channels 83 and nozzles 83a is adhered to the thin plate 82 so that tip ends of the piezoelectric ceramic elements 81 are positioned over corresponding ink channels 83. Application of a voltage to the piezoelectric ceramic elements 81 produces displacement which deforms the thin plate 82 and ejects ink in the ink channel 83 from the nozzles 83a. Dot-pattern characters and other images can therefore be printed.

Also, the pillar-shaped piezoelectric ceramic elements 81 of the ink jet print head shown in FIG. 1 easily break because they are thin independent units. Because the pillar-shaped piezoelectric ceramic elements 81 break easily, production yield of the ink jet print head is low. Also, the ink jet print head is unreliable because the pillar-shaped piezoelectric ceramic elements 81 can easily break when driven.

SUMMARY OF THE INVENTION

U.S. patent application Ser. No. 08/579,159 commonly assigned, pending, filed on Dec. 27, 1995 by the present inventors based on priority of Japanese Patent Application No. HEI-7-3090 describes how sheet forming techniques can be employed to form the piezoelectric material into extremely thin films. An example of a method for producing a stacked body similar to the method described in the copending application is as follows. A piezoelectric material made mainly from lead zirconium titanate (PZT) is mixed to a predetermined composition and then calcined at about 900° C. The resultant powder is mixed with additives such as a binder and a plastic agent to form a slurry. The slurry is force into a gap between a PET film, which has undergone silicon processes to increase its antistick properties, and a doctor blade to form a slurry film on the PET film. The resultant slurry film is dried to form an approximately 100 μm thick green sheet. The green sheet is punched to predetermined dimensions and peeled from the PET film. Then, the surface of the green sheet is coated using screen print techniques with a several micron thick layer of palladium paste, which is the material that will form the internal electrodes of the head. Drying forms internal electrode layers. Several tens of these printed green sheets are stacked and pressed into an integral body using a heat press. Afterward, the binder is removed by heating to about 500° C. A stacked body is obtained by sintering for about two hours at 1,200° C.

However, there has been a problem with the above-described method in that it includes processes that are difficult to completely automate such as removing the green sheet from the PET film and heat pressing the stacked layers. This results in high manufacturing costs. Also, aligning the sheets is difficult because several tens of green sheets are stacked together. Therefore, only a stacked body with poor alignment precision can be prepared. Further, only simple-shaped stacked bodies, such as wherein sheets have a flat rectangular shape, can be obtained with conventional sheet forming techniques such as doctor blades. To produce a complicated shape such as a comb shape used in the head of an ink jet printer, a mechanical process such as dicing must be relied on after preparing the stacked body. This results in the problem of high manufacturing costs because many processes are required. Also, there are limitations to how thin sheets can be formed using the above-described process. Additionally, the thinness of these sheets make them difficult to handle.

The object of the present invention is to solve the above-described problems and to provide a method for manufacturing layered piezoelectric elements that can be easily completely automated, that can produce very thin layers, and that can obtain a piezoelectric layered body using almost no mechanical processing. It is a further object to provide a high-yield method for reliably producing layered piezoelectric elements head at low production costs.

To achieve the above-described objectives and produce a layered piezoelectric element for producing a pressure fluctuation within a cavity of an ink jet print head to eject ink from within the cavity, a method according to the present invention includes the steps of screen printing a slurry of powdered piezoelectric material to form a piezoelectric ceramic layer; screen printing a conductive paste to form an internal electrode layer on the piezoelectric ceramic layer; and repeating in alternation the steps of screen printing the slurry of powdered piezoelectric material and screen printing the conductive paste to obtain a layered body with piezoelectric ceramic layers and internal electrode layers layered in alternation.

According to another aspect of the present invention, the step of screen printing the slurry of powdered piezoelectric material includes using a screen print plate having a pattern formed with a plurality of independent elongated hole portions to form a piezoelectric ceramic layer with holes defining a plurality of actuator portions in at least a central portion of the piezoelectric ceramic layer.

According to a still further aspect of the present invention, every other performance of the step of screen printing the conductive paste forms the first electrode layer as a common electrode to all the actuator portions and remaining performances of the step of screen printing the conductive paste forms the second electrode layer as a plurality of independent drive electrodes at positions corresponding to the actuators so that the first electrode layer and the second electrode layer are juxtaposed in opposition at least at the divided actuator portions in a direction in which the layered body is layered.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENT

Figure 1:
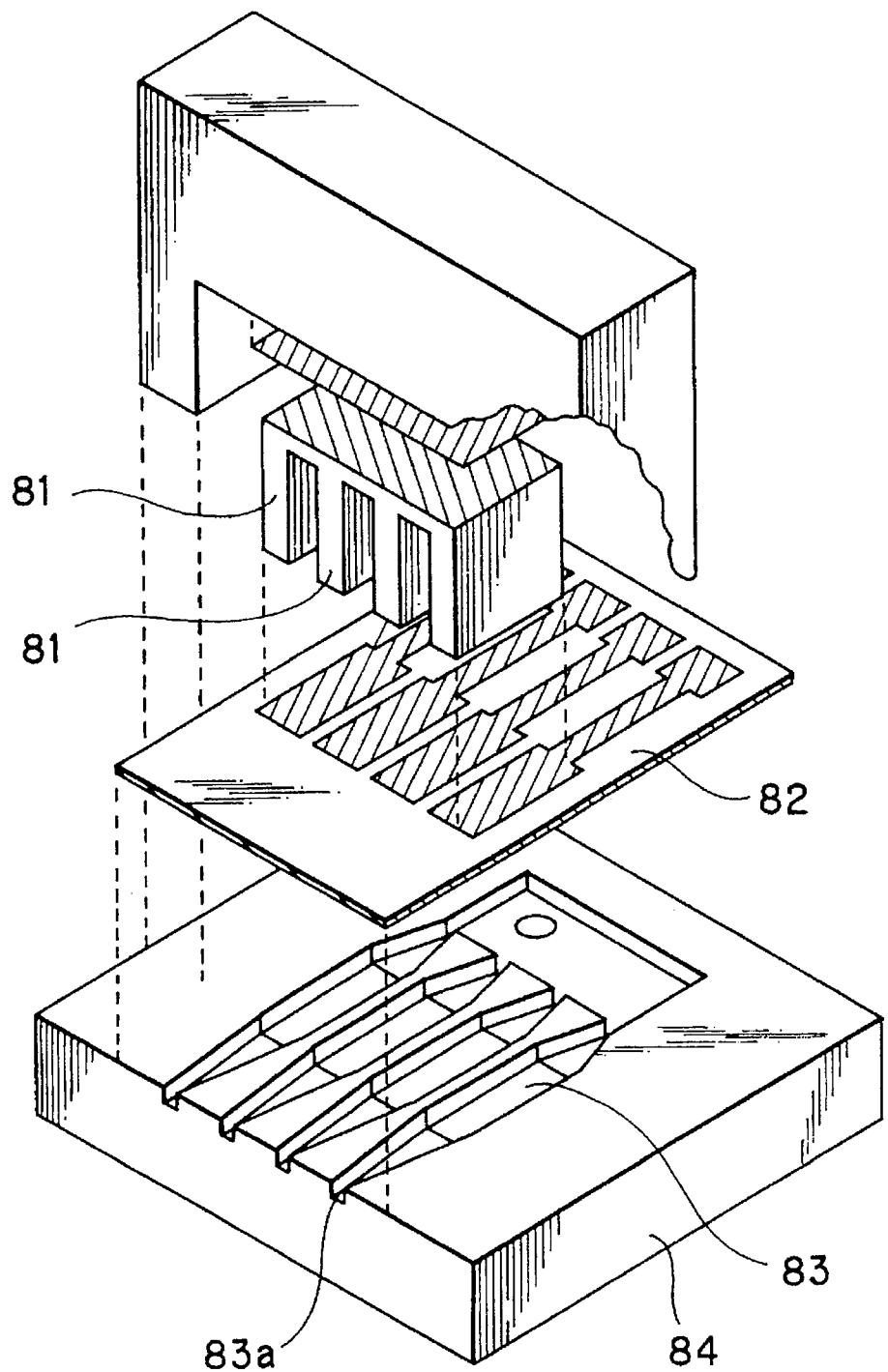
FIG. 1 is a sectional perspective view showing a conventional ink jet print head.

A method of producing a layered piezoelectric element according to a preferred embodiment of the present invention will be described while referring to the accompanying drawings wherein like parts and components are designated by the same reference numerals to avoid duplicating description.

Figure 2:
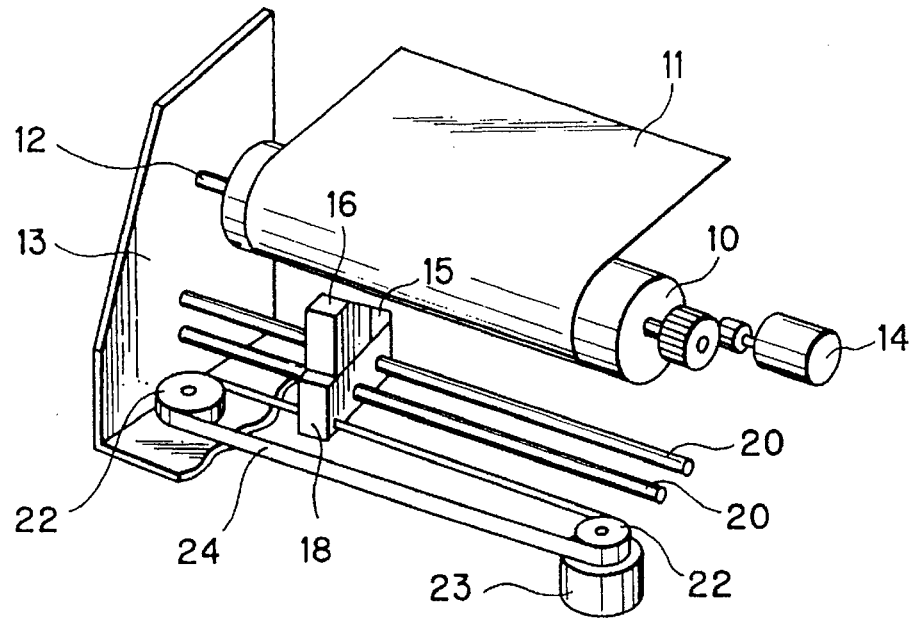
FIG. 2 is a perspective view showing essential portions of an ink jet printer.

FIG. 2 shows essential portions of an ink jet printer to which an ink jet print head 15 is mounted. A platen 10 for feeding a sheet 11 is rotatably mounted to a frame 13 by a shaft 12. A motor 14 is provided for driving the platen 10. Two guide rods 20 are also mounted to the frame 13 in parallel to the axis of the platen 10. A carriage 18 is slidably supported on the two guide rods 20. An ink jet print head 15 and an ink supplier 16 are mounted on the carriage 18 so as to face the platen 10. A timing belt 24 wound on a pair of pulleys 22 is fixed to the carriage 18. A motor 23 is provided for rotating one of the pulleys 22. Feed of the timing belt 24 moves the carriage 18 in alignment with the platen 10.

Figure 3:
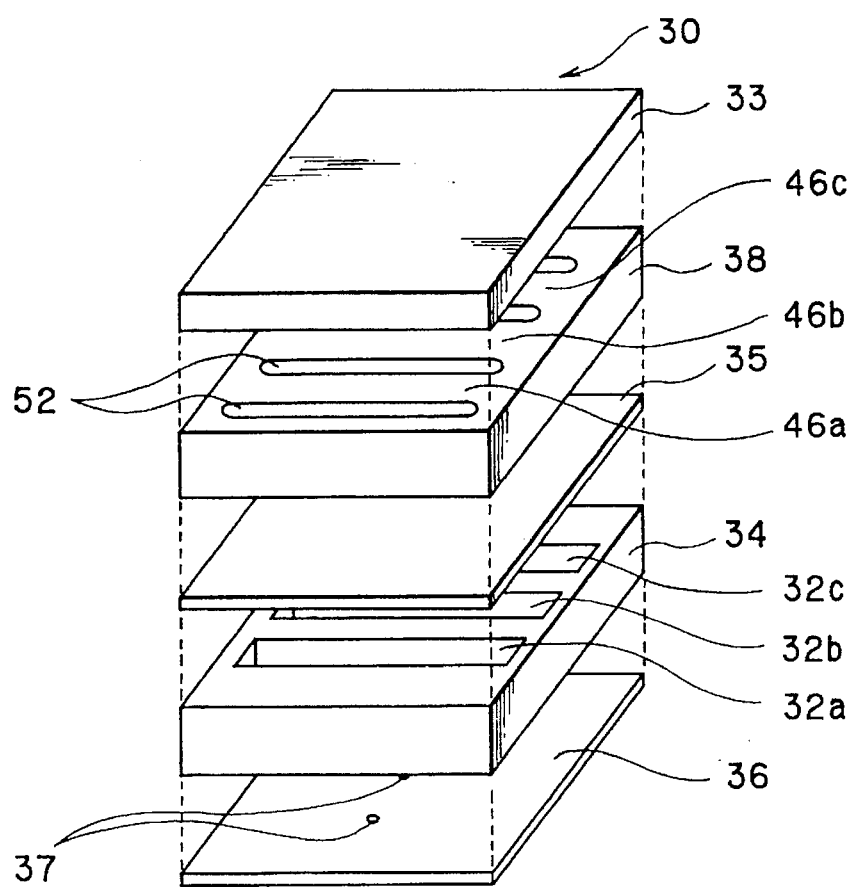
FIG. 3 is an exploded view showing an array of an ink jet print head used in the ink jet printer.

FIG. 3 is an exploded perspective view showing an array 30 used in the ink jet print head 15. The array 30 includes a base plate 33 made from a metal or a ceramic with a high modulus of elasticity, a layered piezoelectric element 38 produced according to the method of the present invention, a thin-film vibration plate 35, a channel main body 34, and an orifice plate 36 formed with orifices 37. These components of the array 30 are attached together in the configuration shown in FIG. 3. That is, the base plate 33 is secured on one side of the layered piezoelectric element 38 and the thin-film vibration plate 35 is disposed to the other side of the layered piezoelectric element 38. The layered piezoelectric element 38 is attached, via the thin-film vibration plate 35, to one side of the channel main body 34 and the orifice plate 36 is attached to the other side of the channel main body 34. The channel main body 34 and the orifice plate 36 are formed by injection molding of a resin material.

The layered piezoelectric element 38 has formed therein a plurality of slit-shaped elongated holes 52 defining therebetween actuator portions 46a, 46b, and 46c. The channel main body 34 has formed therein ink channels 32a, 32b, and 32c extending in parallel with and at positions corresponding to the actuator portions 46a, 46b, and 46c. In the present embodiment, the ink channels 32a, 32b, and 32c are formed longer in the lengthwise direction and wider in the widthwise direction than corresponding actuator portions 46a, 46b, and 46c of the layered piezoelectric element 38.

Figure 4:
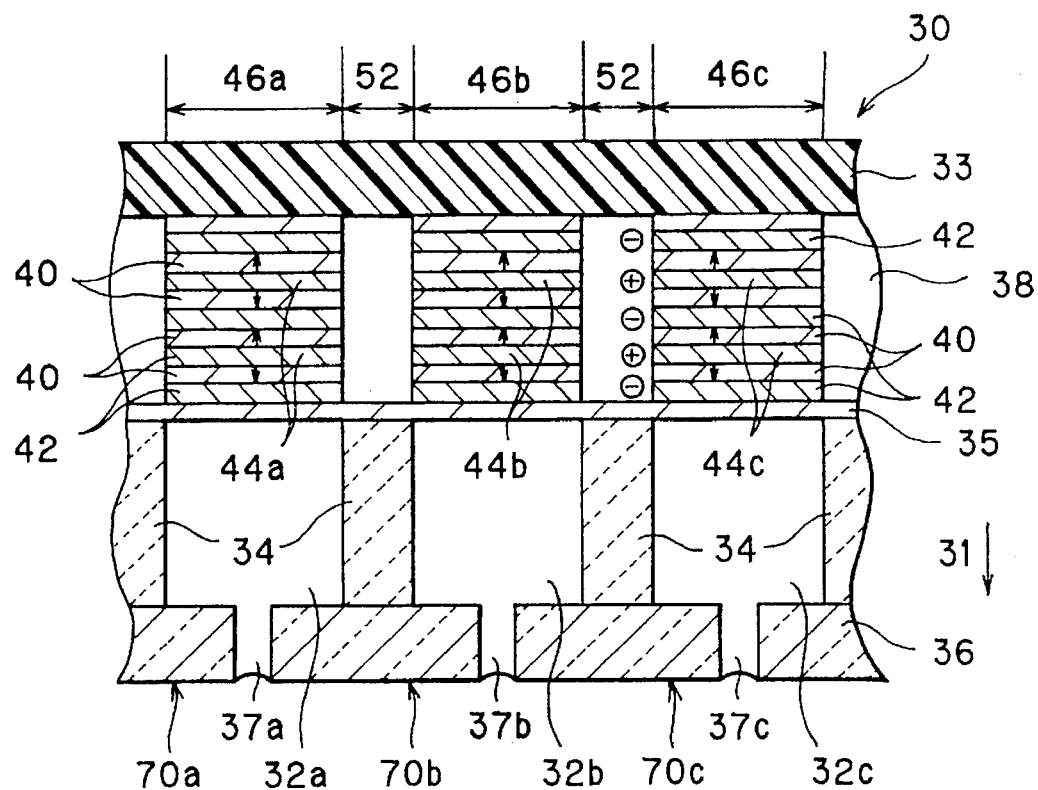
FIG. 4 is a sectional cross-sectional view showing the array.

As can be seen in FIG. 4, the array 30 of the present embodiment includes three ejection devices 70a, 70b, 70c, which include the actuator portions 46a, 46b, and 46c and the ink channels 32a, 32b, and 32c respectively. In other words, the actuator portions 46a, 46b, and 46c of the layered piezoelectric element 38 are positioned at cavities formed by the ink channels 32a, 32b, and 32c (which extend perpendicular to the sheet surface of FIG. 4) so that the layered piezoelectric element 38 serves as a piezoelectric actuator for the three ejection devices 70a, 70b, and 70c.

The layered piezoelectric element 38 is a multi-layered body including: piezoelectric ceramic layers 40 having piezoelectric and electrostrictive properties; internal negative electrode layers 42; and internal positive electrode layers 44a, 44b, and 44c. The piezoelectric ceramic layers 40 are composed of a lead zirconium titanate (PZT) ceramic material with ferroelectric properties. As indicated by arrows at the actuator portions 46a, 46b, and 46c in FIG. 4, the piezoelectric ceramic layers 40 are polarized in the direction in which they are layered. The internal negative electrode layers 42 and internal positive electrode layers 44a, 44b, and 44c are composed of a silver-palladium (Ag-Pd) metal material.

Figure 5:
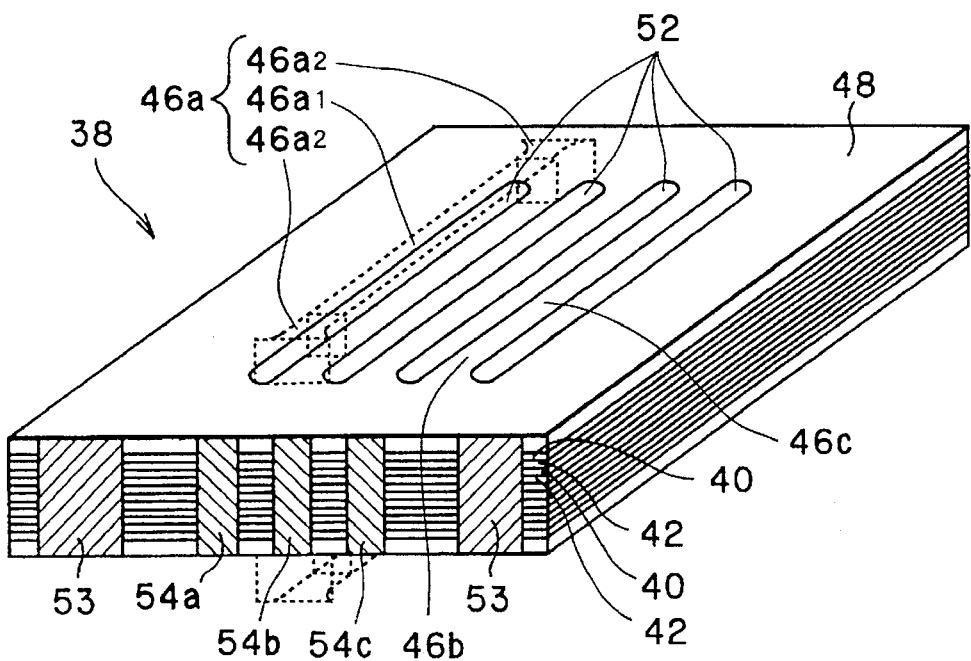
FIG. 5 is a perspective view showing a layered piezoelectric element produced using the method of the present invention.

As can be seen in FIG. 5, the actuator portions 46a, 46b, and 46c are formed at the central portion of the layered piezoelectric element 38 and are divided by the plurality of elongated holes 52. In addition to the actuator portions 46a, 46b, and 46c, the layered piezoelectric element 38 includes a piezoelectric inactive portion 48 at an edge portion thereof. The piezoelectric inactive portion 48 connects end portions of the actuator portions 46a, 46b, and 46c together. The internal positive electrode layers 44a, 44b, and 44c are divided by the elongated holes 52 to a one-to-one correspondence with the ink channels 32a, 32b, and 32c. The internal electrode layers 42, and 44a, 44b, and 44c overlap at overlapping regions $46a_1$ (indicated by dotted lines in FIG. 5), $46b_1$, and $46c_1$, that is, at all areas between the elongated holes except the tips of each actuator portion 46a, 46b, and 46c. On the other hand, internal electrode layers 42, and 44a, 44b, and 44c do not overlap at the piezoelectric inactive portion 48 nor at non-overlapping regions $46a_2$ (indicated by dotted lines in FIG. 5), $46b_2$, and $46c_2$, that is, at the tips of each actuator portion 46a, 46b, and 46c.

The layered piezoelectric element 38 is produced using the following method. A piezoelectric material, which is primarily PZT, is mixed in a desired composition. Then, the powder is calcined at 850° C. Next, a binder and other additives are added to the powder. The mixture dispersed in an organic solvent is mixed in a ball mill for 24 hours to form a piezoelectric material paste.

Figure 6:
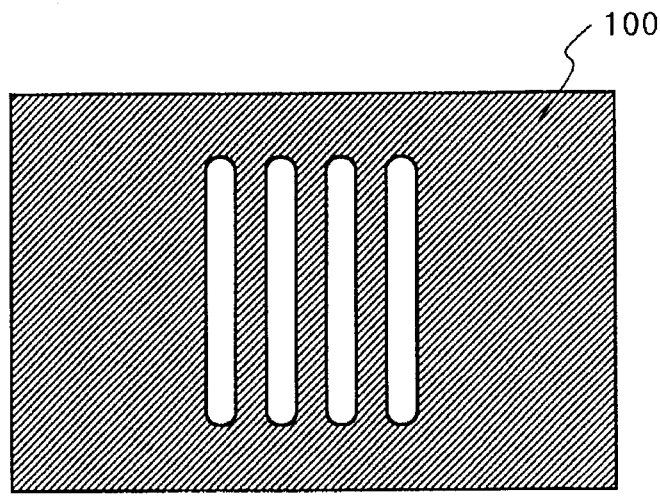
FIG. 6(a), 6(b) and 6(c) are schematic views showing patterns of screen print plates used during the method of the present invention.
Figure 6:
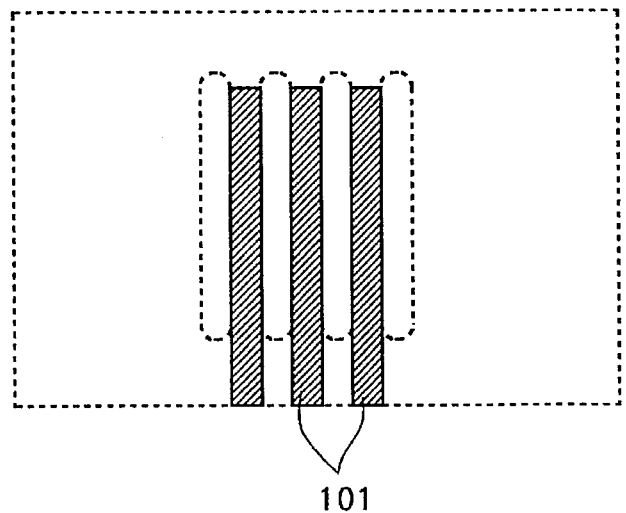
Figure 6:
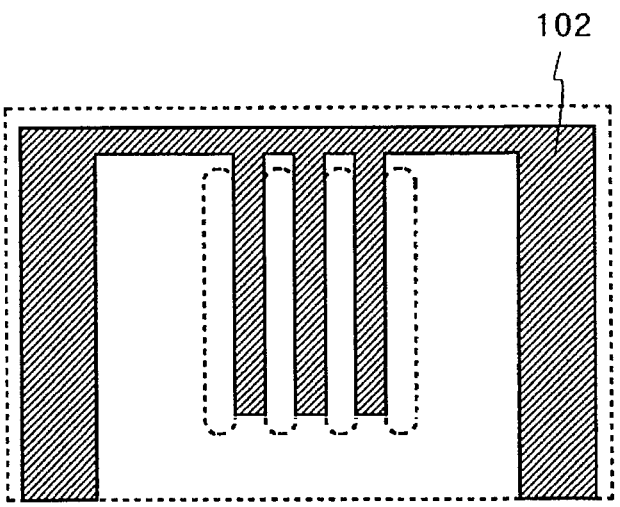
Figure 7:
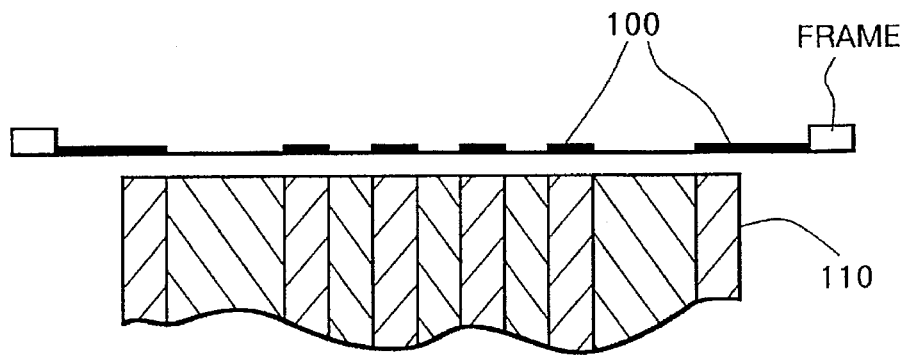
FIG. 7(a), 7(b) and 7(c) are cross-sectional views showing processes in the method of the present invention.
Figure 7:
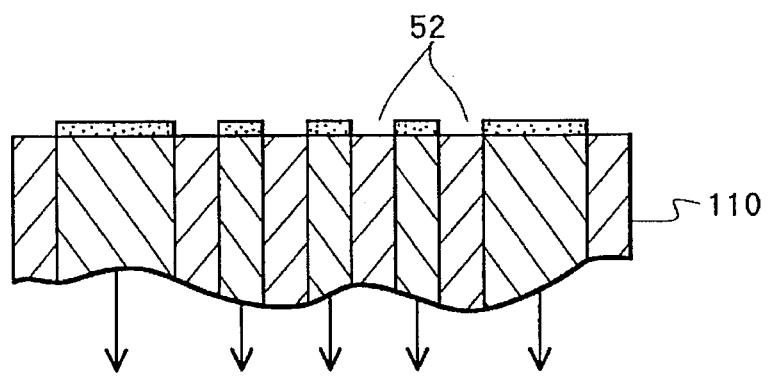
Figure 7:
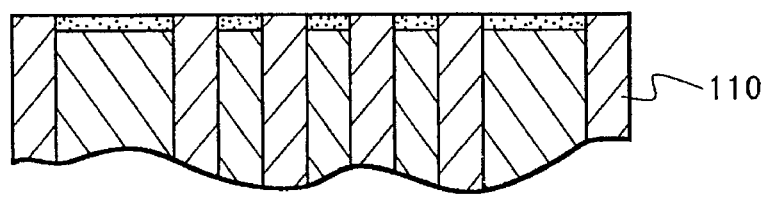

Meanwhile, screen print plates with patterns 100, 101, and 102 shown in FIGS. 6(a), 6(b), and 6(c) respectively are prepared. Also, a metal die 110 shown in cross section in FIGS. 7(a) through 7(c) is prepared with the same outward form as the pattern 100. The die 110 is recessed at portions thereof other than areas corresponding to the elongated holes 52.

Figure 8:
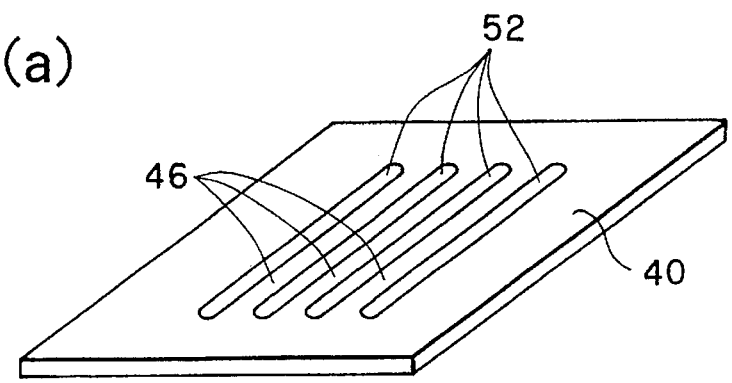
FIG. 8(a), 8(b), 8(c) and 8(d) are perspective views showing layers produced in various processes of the method according to the present invention for manufacturing a layered piezoelectric element.
Figure 8:
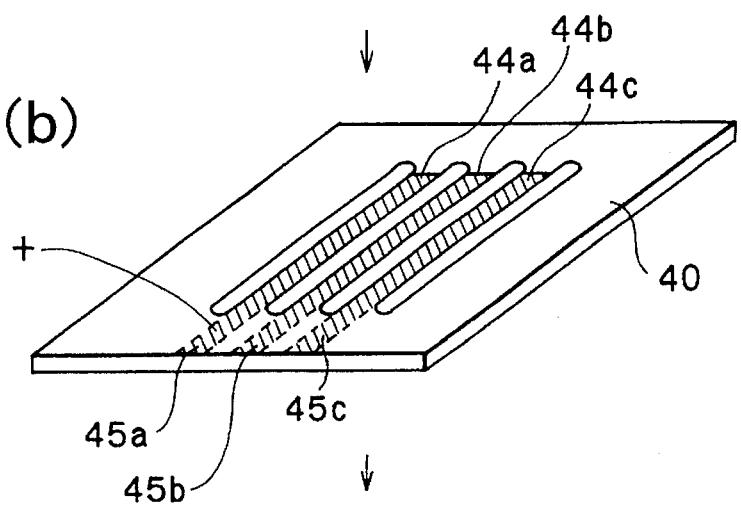
Figure 8:
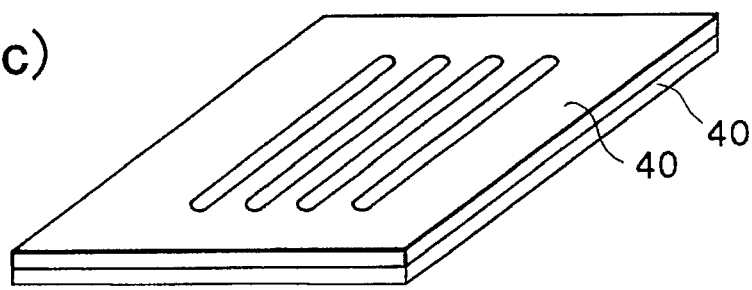
Figure 8:
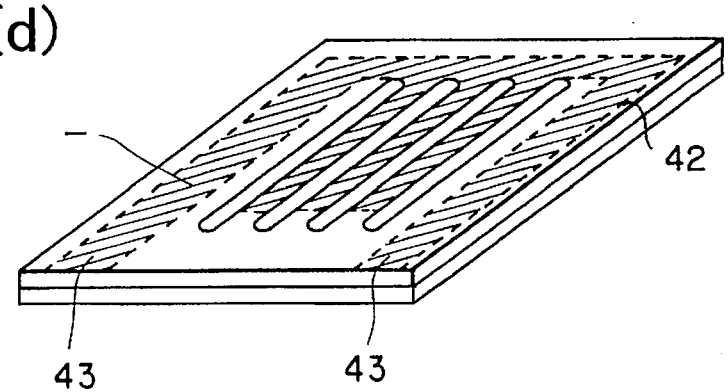

The metal die 110 and the screen print plate having a pattern with elongated hole portions formed to a predetermined pitch as shown in FIG. 6(a) are positioned into alignment as shown in FIG. 7(a). Then, a sheet of PET film is applied to the metal die 110 to prevent the piezoelectric material paste from sticking. The piezoelectric material paste is screen printed and dried to form an approximately 40 μm thick piezoelectric ceramic layer 40 as shown in FIG. 7(b). As shown in FIG. 8(a), the central portion of the piezoelectric ceramic layer 40 is divided into a plurality of actuator portions 46 by elongated hole portions 52.

Next, as shown in FIGS. 7(b) and 7(c), the metal die 110 is lowered a distance equal to the thickness of the printed piezoelectric material film. Then, silver or palladium paste for forming the internal electrodes is screen printed to several microns thickness on the piezoelectric material film using a screen print plate with the pattern 101 shown in FIG. 6(b). After drying, the resultant green sheet will appear as shown in FIG. 8(b). As can be seen, internal positive electrode layers 44a through 44c, which are divided into a plurality having a one-to-one correspondence with the actuator portions, and electrode terminal portions 45a, 45b, and 45c are formed on the upper surface of the piezoelectric ceramic layer 40.

Then, again piezoelectric material paste is printed using the screen print plate having the pattern 101 shown in FIG. 6(a) and dried, resulting in the layered body shown in FIG. 8(c). Afterward, the internal electrode paste is printed using the screen print plate with the pattern 102 shown in FIG. 6(c) and dried, resulting in the formation of an internal negative electrode layer 42, which traverses all the ink channels 32a through 32c, and its electrode terminal portions 43 as shown in FIG. 8(d).

These processes are repeated until a predetermined number of layers are obtained. Lastly, a piezoelectric ceramic layer 40 is again printed and dried. Afterward, heat pressing is performed. Degreasing is performed at 500° C. and sintering is performed at 1,200° C. to obtain a layered body made from piezoelectric ceramics wherein piezoelectric ceramic layers 40 and internal electrodes 42 and 44 are alternately layered. The electrode terminal portions 43 and 54 of the internal electrodes 42 and 44 are exposed at one side surface.

It should be noted that the piezoelectric ceramic layer 40 need not be limited to the approximately 40 micron thickness described in the present embodiment. The piezoelectric ceramic layer 40 can be formed using screen printing to the same several microns thickness of the internal electrodes 42 and 44. Alternatively, when it is desired to form a thick piezoelectric ceramic layer 40, screen printing with the piezoelectric material paste can be repeated a plurality of times to form a layer with a desired thickness.

Outer negative electrodes 53 and outer positive electrodes 54a, 54b, 54c are attached to locations where the electrode terminal portions 43, 45a, 45b, and 45c are exposed in the thus-formed layered body Then, a well-known polarization process is executed to polarize the layered body by application of an electric field. The polarization process can be carried out, for example, by immersing the layered body into an oil bath (not shown) filled with an electrically insulating oil, such as silicon oil, heated to about 130° C. An electric field of approximately 2.5 kV/mm is then applied between the outer negative electrodes 53 and the outer positive electrodes 54a, 54b, and 54c to polarize the layered body. If the piezoelectric ceramic layers 40 of the layered body are sufficiently thin, for example, approximately 50 μm, they can be easily polarized without providing a special environment such as the oil bath. In this case, a voltage of approximately 30 V is applied between the outer negative electrodes 53 and the outer positive electrodes 54a, 54b, and 54c after the ink jet print head 15 has been assembled.

The layered piezoelectric element 38 shown in FIG. 5 can be obtained using the above method. The layered piezoelectric element 38 is mounted to an ink jet print head after polishing and shot blast processes.

The layered piezoelectric element 38 formed through the above-described method has actuator portions 46a, 46b, and 46c connected by their end portions to the piezoelectric non-active region 48. Therefore, even if the actuator portions 46a, 46b, and 46c are thin, they will be supported by the piezoelectric non-active region 48 and so will not break or be damaged during production.

Figure 9:
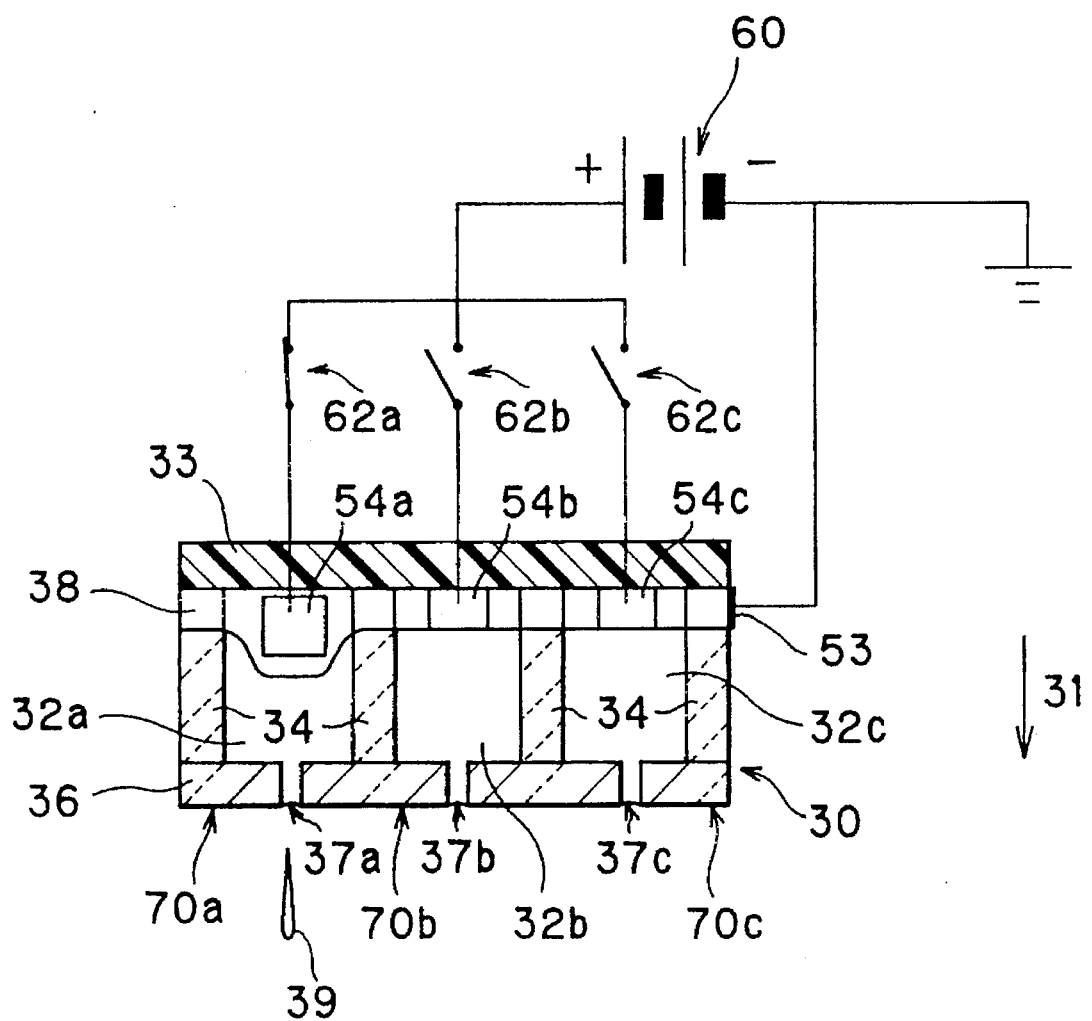
FIG. 9 is a perspective view showing electric circuits provided for driving the array.

Electric circuits provided in the array 30 are shown in FIG. 9. The outer positive electrodes 54a, 54b, and 54c of the layered piezoelectric element 38 are connected to the positive electrode of a drive power source 60 through openable and closable switches 62a, 62b, 62c. The outer negative electrodes 53 of the layered piezoelectric element 38 and the negative electrode of the drive power source 60 are grounded. A controller (not shown) opens and closes the switches 62a, 62b, and 62c to selectively apply a driving voltage from the drive power source 60 between the internal negative electrode layers 42 and the internal positive electrode layers 44 located on a selected one of the actuator portions 46a, 46b, or 46c.

Next, the operation of an ink jet print head 15 having the above-described configuration will be described. For convenience of explanation, it will be assumed that the array 30 according to the present embodiment is provided with three ink channels.

In accordance with predetermined print data, the controller closes, for example, the switch 62a so that a voltage is applied between the internal negative electrode layers 42 and internal positive electrode layers 44a of the actuator portion 46a, resulting in a bias electric field developing in the piezoelectric ceramic layers 40 between these internal electrode layers. Dimensional distortion caused by piezoelectric and electrostrictive longitudinal effects lengthen the actuator portion 46a in the vertical direction of FIG. 9, thereby reducing the volume in the ink channel 32a. An increase in pressure accompanying this volume change ejects ink in the ink channel 32a from the orifice 37a as a droplet 39. Following this, the switch 62a is opened and the application of voltage is cut off, returning the actuator portion to its original form. As the ink channel 32a increases in volume, ink is refilled into the ink channel 32a from the ink supply device 16 via a separate valve (not shown). To give a further example, if another switch 62b is closed, displacement of the actuator portion 46b will occur so that ink will be ejected from the ink channel 32b. Because the piezoelectric ceramic layers 40 are polarized in the direction in which they are layered, a large amount of deformation develops in the layered direction, resulting in highly reliable ink ejection.

Next will be described deformation undergone by the layered piezoelectric element 38 in an array direction 31 when a voltage is applied thereto. When a voltage of 25 V is applied to, for example, actuator portion 46a, then the overlapping region $46a_1$ undergoes a significant displacement of 200 nm or more. On the other hand, the piezoelectric inactive section 48 hardly undergoes displacement at all. Further, displacement at the overlapping region $46a_1$ pulls the non-overlapping regions $46a_2$, creating some displacement there also. Because the ink channels 32a, 32b, and 32c are formed longer in the lengthwise direction than the actuator portions 46a, 46b, and 46c, the actuator portion 46a can efficiently deform into corresponding ink channel 32a. Consequently, droplet 39 can be effectively ejected using a low driving voltage of only 30 V.

The piezoelectric ceramic layer 40 can be made sufficiently thin using screen printing to allow ejection using a low drive voltage.

Manufacturing a layered piezoelectric element according the method of the present invention eliminates the need to align plates when layering the plates. Also, there are no processes for removing, drying, stacking, and pressing the sheets. The method includes only repeating simple screen printing processes. Therefore, the method is easy to automate and production management can be simplified.

Also, the shape to which layers are formed can be freely set. A layered body can therefore be easily formed, without mechanical processes, in many shapes in accordance with the pattern shape of the screen print plate. As a result, print heads can be made in more compact sizes by forming piezoelectric elements in shapes that suit the shape of the print head. Mechanical processes are particularly minimized after sintering, which allows reductions in manufacturing costs. A piezoelectric element divided into a plurality of actuator portions can be prepared without performing any mechanical processes such as dicing. Screen printing allows forming thin layers, which allows providing a piezoelectric element that can be driven with a low voltage and allows producing a compact print head that uses the piezoelectric element.

In the piezoelectric ink jet printer 15 of the present embodiment, a single layered piezoelectric element 38 serves as piezoelectric actuators for all the ejection devices 70a, 70b, and 70c. Therefore, a plurality of arrays 30 assembled together can provide an ink jet print head 15 with a simple configuration that can be produced using simple methods. Therefore, the number and complexity of manufacturing processes can be reduced so that production costs can be reduced. In addition, because the piezoelectric actuators are layered piezoelectric elements 38 and because the ink channels 32a, 32b, and 32c are formed longer in the lengthwise direction khan corresponding actuator portions 46a, 46b, and 46c, consequently, the actuator portions 46a, 46b, and 46c can effectively and easily deform into corresponding ink channels 32a, 32b, and 32c so that driving voltage can be significantly reduced.

Further, because the internal electrode layers 42, 44 of the layered piezoelectric element 38 are formed by screen printing, the electrodes can be simply formed even when the actuator portions 46a, 46b, and 46c and the elongated holes 52 are formed extremely thin. Therefore, an array 30 including the ejection devices 70a, 70b, and 70c can be formed to a small size so that a print head that allows high resolution and a wide printing range can be achieved.

Further, each of the actuator portions 46a, 46b, and 46c divided by the elongated holes 52 are supported connected together at their end portions by the piezoelectric non-active region 48. Consequently, even when the actuator portions 46a, 46b, and 46c are formed to a narrow width, they will not break or be damaged during production or drive of the print head. Therefore, yield when producing the print head is improved. The actuator portions 46a, 46b, and 46c will also not break when driven, thereby improving reliability of the resultant print head. Also, if the actuator portions 46a, 46b, and 46c can be formed thinner, they can be formed into a more highly integrated unit, which improves print quality of the resultant ink jet print head.

Still further, only the electrode terminal portions 43, 45 of the internal negative electrode layers 42 and internal positive electrode layers 44 of the layered piezoelectric element 38 according to the present embodiment are exposed to the exterior. Therefore, deterioration of insulating properties, such as deterioration caused by silver migration, is eliminated. Further, advantages such as superior durability and moisture resistance are gained. Also, because the outer negative electrodes 53 and the outer positive electrodes 54a, 54b, and 54c connected to the internal electrode layers 42, 44a, 44b, and 44c are formed on the same side surface of the layered piezoelectric element 38, the electrodes can be easily picked up and collectively electrically connected to a drive control circuit or a circuit substrate for controlling drive of the print head. Also, the outer negative electrodes 53 and the outer positive electrodes 54a, 54b, and 54c can be connected to the electric circuit at a single side surface of the array 30 so that less space is taken up.

While the invention has been described in detail with reference to specific embodiments thereof, it would be apparent to those skilled in the art that various changes and modifications may be made therein without departing from the spirit of the invention, the scope of which is defined by the attached claims.

For example, in the above-described embodiments, one layered piezoelectric element 38 serves as piezoelectric actuators for the three ejection devices 70a, 70b, and 70c. However, piezoelectric actuators for additional ejection devices can be formed by adding to, or changing the pattern of, the internal positive electrode layers 44.

Further, in the above embodiment, the internal positive electrode layers 44 are divided in a one-to-one correspondence to the ink channels 32a, 32b, and 32c. However, the internal negative electrode layers 42 may be divided to a one-to-one correspondence to the ink channels 32a, 32b, and 32c. Alternatively, both the internal positive electrode layers 44 and the internal negative electrode layers 42 may be separated in a one-to-one correspondence to the ink channels 32a, 32b, and 32c. That is, it is sufficient for at least one of the internal electrode layers, either positive or negative, to be divided in a one-to-one correspondence to the ink channels 32a, 32b, and 32c.

Also, the array 30 can be provided with more or less than the three ink channels described in the present embodiment.

In the above-described embodiment, the electrode terminal portions 43 and 45 of the electrode layers 42 and 44 are exposed at the same single surface of the layered piezoelectric element 38. However, as is often seen in layered capacitors, the electrode terminal portions 43 and 45 for the internal positive electrode layers 44 and the internal negative electrode layers 42 can be exposed from different side surfaces.

What is claimed is:

1. A method of producing a layered piezoelectric element for producing a pressure fluctuation within a cavity of an ink jet print head to eject ink from within the cavity, the production method comprising the steps of:

screen printing a slurry of powdered piezoelectric material to form a piezoelectric ceramic layer;

screen printing a conductive paste to form an internal electrode layer on the piezoelectric ceramic layer;

repeating in alternation the steps of screen printing the slurry of powdered piezoelectric material and screen printing the conductive paste to obtain a layered body with piezoelectric ceramic layers and internal electrode layers layered in alternation, wherein said internal electrode layers are alternately positive and negative with said piezoelectric ceramic layers provided between positive internal electrode layers and negative internal electrode layers; and polarizing the piezoelectric ceramic layers in a direction in which an electric field is generated between the internal electrode layers upon application of a voltage thereto;

wherein every other performance of the step of screen printing the conductive paste includes using a screen print plate having a first pattern to form a first electrode layer on a piezoelectric ceramic layer, and remaining performances of the step of screen printing the conductive paste includes using a screen print plate having a second pattern to form a second electrode layer on a piezoelectric ceramic layer that is layered on a first electrode layer, and wherein the step of screen printing the slurry of powdered piezoelectric material includes using a screen print plate having a pattern formed with a plurality of independent elongated hole portions to form a piezoelectric ceramic layer with holes defining a plurality of actuator portions in at least a central portion of the piezoelectric ceramic layer.

2. A method of producing a layered piezoelectric element as claimed in claim 1 wherein the step of screen printing a conductive paste forms an electrode layer with all terminal portions at a single edge of a corresponding piezoelectric ceramic layer on which the electrode layer is formed.

3. A method of producing a layered piezoelectric element as claimed in claim 2 wherein repeating the step of screen printing a conductive paste in alternation with the step of screen printing a slurry of powdered piezoelectric material produces the layered body with terminal portions of electrode layers exposed from a single side of the layered body.

4. A method of producing a layered piezoelectric element as claimed in claim 1:

wherein every other performance of the step of screen printing the conductive paste forms the first electrode layer as a common electrode to all the actuator portions and wherein remaining performances of the step of screen printing the conductive paste forms the second electrode layer as a plurality of independent drive electrodes at positions corresponding to the actuators so that the first electrode layer and the second electrode layer are juxtaposed in opposition at least at the divided actuator portions in a direction in which the layered body is layered.

5. A method of producing a layered piezoelectric element as claimed in claim 4 wherein the step of screen printing a conductive paste forms an electrode layer with all terminal portions at a single edge of a corresponding piezoelectric ceramic layer on which the electrode layer is formed.

6. A method of producing a layered piezoelectric element as claimed in claim 5 wherein repeating the step of screen printing a conductive paste in alternation with the step of screen printing a slurry of powdered piezoelectric material produces the layered body with all terminal portions of electrode layers exposed from a single side of the layered body.

7. A method of producing a layered piezoelectric element as claimed in claim 1:

wherein the step of screen printing the slurry of powdered piezoelectric material includes screen printing the slurry into a sheet shape using a screen print plate having a pattern with at least a plurality of independent regions;

wherein the step of screen printing the conductive paste includes a first process using a screen print plate having a first pattern to form a first electrode layer on the piezoelectric ceramic layer and a second process using a screen print plate having a second pattern to form a second electrode layer layered on the first electrode layer, the first process and the second process being performed in alternation with each other and with the step of screen printing the slurry of powdered piezoelectric material performed in between to form a layered body wherein each electrode layer is sandwiched by piezoelectric ceramic layers and wherein the first electrode layers and the second electrode layers are in alternation with each other.

8. A method of producing a layered piezoelectric element for producing a pressure fluctuation within a cavity of an ink jet print head to eject ink from within the cavity, the production method comprising the steps of:

screen printing a slurry of powdered piezoelectric material to form a piezoelectric ceramic layer;

screen printing a conductive paste to form an internal electrode layer on the piezoelectric ceramic layer;

repeating in alternation the steps of screen printing the slurry of powdered piezoelectric material and screen printing the conductive paste to obtain a layered body with piezoelectric ceramic layers and internal electrode layers layered in alternation, wherein said internal electrode layers are alternately positive and negative with said piezoelectric ceramic layers provided between positive internal electrode layers and negative internal electrode layers; and polarizing the piezoelectric ceramic layers in a direction in which an electric field is generated between the internal electrode layers upon application of a voltage thereto;

wherein the step of screen printing the slurry of powdered piezoelectric material includes screen printing the slurry into a sheet shape using a screen print plate having a pattern with at least a plurality of independent regions;

wherein the step of screen printing the slurry of powdered piezoelectric material includes using a screen print plate having a pattern formed with a plurality of independent elongated hole portions to form a piezoelectric ceramic layer with holes defining a plurality of actuator portions in at least a central portion of the piezoelectric ceramic layer; and wherein the step of screen printing the conductive paste includes a first process using a screen print plate having a first pattern to form a first electrode layer on the piezoelectric ceramic layer and a second process using a screen print plate having a second pattern to form a second electrode layer layered on the first electrode layer, the first process and the second process being performed in alternation with each other and with the step of screen printing the slurry of powdered piezoelectric material performed in between to form a layered body wherein each electrode layer is sandwiched by piezoelectric ceramic layers and wherein the first electrode layers and the second electrode layers are in alternation with each other.

9. A method of producing a layered piezoelectric element as claimed in claim 8:

wherein the first process forms the first electrode layer as a common electrode to all the actuator portions;

wherein the second process forms the second electrode layer as a plurality of independent drive electrodes corresponding to the actuators; and wherein the first electrode layer and the second electrode layer are juxtaposed in opposition at least at the divided actuator portions in a direction in which the layered body is layered.

10. A method of producing a layered piezoelectric element as claimed in claim 8 wherein the step of screen printing a conductive paste forms an electrode layer with all terminal portions at a single edge of a corresponding piezoelectric ceramic layer on which the electrode layer is formed.

11. A method of producing a layered piezoelectric element as claimed in claim 10 wherein repeating the step of screen printing a conductive paste in alternation with the step of screen printing a slurry of powdered piezoelectric material produces the layered body with all terminal portions of electrode layers exposed from a single side of the layered body.

\* \* \* \* \*